United States Patent [19]
Rapp

[11] 3,998,667
[45] * Dec. 21, 1976

[54] BARIUM ALUMINOBOROSILICATE GLASS-CERAMICS FOR SEMICONDUCTOR DOPING

[75] Inventor: James E. Rapp, Oregon, Ohio

[73] Assignee: Owens-Illinois, Inc., Toledo, Ohio

[ * ] Notice: The portion of the term of this patent subsequent to Sept. 23, 1992, has been disclaimed.

[22] Filed: Dec. 19, 1975

[21] Appl. No.: 642,287

Related U.S. Application Data

[60] Division of Ser. No. 534,860, Dec. 20, 1974, Pat. No. 3,962,000, which is a continuation-in-part of Ser. No. 431,212, Jan. 7, 1974, Pat. No. 3,907,618.

[52] U.S. Cl. .................................. 148/22; 148/186; 148/188; 148/189; 106/39.6; 106/39.7; 106/54; 252/950; 252/951
[51] Int. Cl.² ...................................... H01L 21/223
[58] Field of Search .......... 148/188, 189; 106/39.6, 106/39.7, 54; 252/950, 951

[56] References Cited

UNITED STATES PATENTS

| | | |
|---|---|---|
| 3,907,618 | 9/1975 | Rapp .................. 148/189 |
| 3,920,882 | 11/1975 | Venkatu ............. 148/189 |
| 3,923,563 | 12/1975 | Venkatu ............. 148/189 |
| 3,928,096 | 12/1975 | Vergano et al. ......... 148/189 |

*Primary Examiner*—G. Ozaki
*Attorney, Agent, or Firm*—Charles S. Lynch; E. J. Holler; Howard G. Bruss, Jr.

[57] ABSTRACT

Disclosed are $B_2O_3$-containing glass-ceramic bodies made by in situ thermal crystallization of glasses and useful as a host for diffusion doping of semiconductors by the vapor phase transport of $B_2O_3$ to the semiconductor from the glass-ceramic which in mole percent consists essentially of over 40 and up to 60 $SiO_2$, 10 to 30 $Al_2O_3$, 20 to 40 $B_2O_3$ and 3 to 20 alkaline earth oxides including 1 to 15 BaO wherein the ratio of $Al_2O_3$ to alkaline earth oxides is from 1.5 to 4.

5 Claims, 3 Drawing Figures

BARIUM ALUMINOBOROSILICATE GLASS-CERAMICS FOR SEMICONDUCTOR DOPING

This is a division of application Ser. No. 534,860, filed 12/20/74 now U.S. Pat. No. 3,962,000 which in turn is a continuation-in-part of parent case Ser. No. 431,212 filed 1/7/74 now U.S. Pat. No. 3,907,618, the disclosure of which is incorporated by reference.

This invention is an improvement over the invention U.S. Pat. No. 3,907,618, and relates to diffused-junction type semiconductor devices, and especially to a new method for diffusing boron into silicon and germanium semiconductors. More particularly, the present invention pertains to a precise and readily controllable method for diffusing a boron-containing layer in at least a portion of the surface of a silicon or germanium semiconductor for the purpose of forming a semiconductor junction therein.

Semiconductors have been known in the industry for many years, and the term semiconductor element has been considered generic to silicon, germanium and silicon-germanium alloys. As used herein, the term "semiconductor" is intended to mean such silicon, germanium and silicon-germanium alloy semiconductor elements. Such elements can be circular, rectangular or triangular or any other convenient geometric shape, although they are usually in the form of a wafer or disc in most commercial situations.

Such silicon semiconductors have an active impurity incorporated therein during manufacture or later by diffusion, which impurity affects the electrical rectification characteristics of the semiconductor as distinguished from other impurities which may have no appreciable effect on those characteristics. Active impurities are usually classified as donor impurities or acceptor impurities. The donor impurities include phosphorus, arsenic and antimony and the acceptor impurities include boron, gallium, aluminum and indium. In other cases, the silicon semiconductors are essentially free of such impurities and are called "intrinsic" semiconductors.

With respect to the nomenclature used in the semiconductor art, a zone of semiconductor material containing an excess of donor impurities and yielding an excess of free electrons is said to exhibit N type conductivity. On the other hand, P type conductivity is exhibited by a zone containing an excess of acceptor impurities resulting in a deficit of electrons or an excess of "holes". In other words, N type conduction is characterized by electron conduction whereas a P type conduction is one characterized by hole conduction. Intrinsic (sometimes called "I" type) silicon semiconductors contain neither donor or acceptor impurities.

When a continuous solid specimen of semiconductor material has an N type zone adjacent to P type zone, the boundary between them is termed a P-N or N-P junction and the specimen of semiconductor material is termed a P-N junction semiconductor device. When a zone of P type conductivity is adjacent a zone of greater P type conductivity, the junction is called a P-P$^+$ junction. When a zone of N type conductivity is adjacent a zone of greater N type conductivity, the junction is called an N-N$^+$ junction. Semiconductor junctions of the P-I type and N-I type also exist. The present invention encompasses the diffusion doping of boron to form P (including "P$^+$") zones in the above types of semiconductor devices.

Semiconductors have application and utility for purposes such as rectifiers, transistors, photodiodes, solar batteries, semiconductor controlled rectifiers and other devices. In addition to general electronic applications, the P-N junction semiconductor is frequently used as a radiation detector of charged particle detector.

Commonly assigned, copending application Ser. No. 431,212 filed 1/7/74 now U.S. Pat. No. 3,907,618 discloses the incorporation of as high as 60 mole percent $B_2O_3$ in the glass-ceramic dopant hosts while maintaining rigidity and dimensional stability during high temperature doping. This feature is extremely important because the rate at which $B_2O_3$ vapors are generated by the glass-ceramic dopant host during doping, generally increases as the concentration as $B_2O_3$ in the dopant host increases. Unfortunately in high temperature doping applications (e.g. above 1050° C) the boron dopes at such a high rate that a much heavier deposition is made on the semiconductor that can dissolve and diffuse into the semiconductor.

When the semiconductor being doped is silicon, a deposit of an undesirable compound believed to be a boron silicide compound formed by reaction of the excess boron with silicon. This undesirable compound is visible as a dark brown or bluish yellow stain depending on the thickness. The color and intensity of the stain is believed to be a function of the amount of undesirable compound present due to interference patterns. The bluish yellow stains indicate the thicker accumulation of undesirable deposit. This deposit is electrically insulating in nature and must be removed from the doped semiconductor. The boron silicide compound is not readily removed by washing with hydrofluoric acid and is usually "loosened" for removal by an oxidation reaction in an oxygen containing atmosphere. The deposition of this boron silicide compound is usually more pronounced when fresh boron dopant hosts are being used.

The present invention provides the unique and desirable combination of concentration of BaO, $B_2O_3$, $Al_2O_3$, and $SiO_2$ in the glass-ceramic dopant host to provide a controlled rate of doping at high temperatures (e.g. >1050° C) which reduces the tendency for formation of the undesirable insulating deposit as well as thermal stability and rigidity at such temperatures in excess of 1050° C, even when the dopant host is in the form of a thin wafer.

The above and other features and advantages of the present invention will become apparent from the following detailed description thereof taken in conjunction with the drawing wherein.

Figure 1:
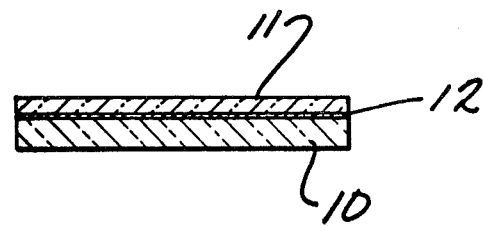
FIG. 1 is a cross-sectional view of the semiconductor body, having been processed in accordance with the method described herein.

The present invention overcomes the difficulties of the prior art methods by utilizing a rigid, dimensionally stable, substantially alkali metal oxide free barium aluminoborosilicate glass-ceramic dopant host as a dopant source or host for vapor phase transport of $B_2O_3$ to the semiconductor. According to the present invention, the glass-ceramic dopant host is maintained in vapor phase communication (with or without the presence of a carrier gas) with a semiconductor at a temperature and for a time sufficient to transport $B_2O_3$ from the dopant host to the surface of the semiconductor. The semiconductor so treated is then heated, with or without the continued presence of the glass-ceramic dopant host for a time sufficient to permit diffusion of boron into the semiconductor to the desired depth.

A commercially significant embodiment of the invention is an N-type silicon semiconductor which has formed therein a boron-containing layer defining a P-type zone. The reverse side of the silicon chip or wafer retains its N-type nature and, accordingly, the product produced by this invention is a P-N junction semiconductor device.

The invention is described in terms of the "vapor phase transport of $B_2O_3$" for lack of a clear understanding of the boron-containing species vaporized from the glass-ceramic host. Accordingly, this term includes whatever boron-containing species is responsible for the transport effect. Similarly, the diffusion process is discussed in terms of "boron diffusion" into the semiconductor for lack of a clear understanding of the boron-containing species actually being diffused. Accordingly, this term includes whatever boron-containing species is responsible for the diffusion doping effect.

Boron is deposited from the vapor phase onto the surface of the semiconductor and diffuses to a controlled depth within the silicon wafer. The rate of vapor phase transport of $B_2O_3$ from the present glass-ceramic dopant is not excessive so as to reduce the tendency for accumulation of the undesirable insulating compound. The concentration and depth of the junction is proportional to the time and temperature of the doping and diffusing process.

The glass-ceramic dopant host must be rigid and dimensionally stable at the doping temperatures so that deformation is not a problem when the dopant source is planar in configuration. In planar diffussion doping, a planar (i.e. generally flat) surface of a solid dopant host and a planar surface of the semiconductor to be doped are positioned parallel in spaced confronting relationship during the diffusional heat treatment. In that the concentration of $B_2O_3$ on the surface of the semiconductor is a function of the distance between the planar surfaces, dimensional stability of the dopant host is of the utmost importance in achieving uniformity in boron distribution on the surface of the silicon semiconductor.

The glass-ceramic dopant hosts particularly useful for practicing the present invention are formed from certain barium aluminoborosilicate glasses which are subtantially free of alkali-oxide. By substantially alkali-free, it is meant that the glasses do not contain sufficient alkali oxides (e.g., $K_2O$, $Na_2O$, and $Li_2O$) to yield a vapor phase containing such oxides at the doping temperatures. It has been found that presence of such alkali oxides in the vapor phase contributes undesirable conductivity characteristics to the resulting semiconductor. In the usual practice of the present invention, the combined alkali oxides are less than about 0.5 mole % and preferably less than 0.1 mole % of the glass-ceramic dopant composition. Preferably the alkali oxides are absent altogether, although this is not always possible because batch materials often contain alkali oxides as impurities.

The term "glass-ceramic" body is used herein according to its conventional meaning and refers to a semicrystalline ceramic body which is composed of at least one crystalline phase randomly dispersed in a residual glassy phase or matrix. Such crystalline phase is formed by the in-situ thermal crystallization of a parent glass composition.

The heat treatment process for forming glass-ceramics from a parent glass usually include a nucleation stage at substantially the temperature of the annealing point (viscosity $10^{13}$ poises) of the parent glass, a development stage at a temperature below the fiber softening point of the parent glass (preferably at a viscosity in the range of $10^8$ to $10^{12}$ poises), and a crystallization stage (at a temperature preferably 150° to 300° F. above the fiber softening point of the parent glass (i.e., viscosity of $10^{7.65}$ poises).

Although the crystallization process itself is not the subject of the present invention, the following description is given in the interest of completeness of disclosure. The parent glass to be crystallized is heated to a temperature corresponding to a viscosity of about $10^{13}$ poises and maintained at this temperature long enough to permit the formation of submicroscopic crystals dispersed throughout a glassy matrix. This is commonly known as the nucleation. The time required for the nucleation period varies according to the composition and is typically from ¼ to 24 hours.

The glassy matrix containing the nucleated crystals is then heated to a temperature corresponding to a viscosity of approximately $10^8$ poises. This thermal condition is maintained for a sufficient time to permit partial crystallization to form a rigid, crystalline structure. The submicroscopic nuclei dispersed in the glassy matrix as a result of the nucleation phase act as growth centers for the rigid framework formed during this second or development stage of the heating cycle. The development stage varies with composition and is typically ¼ to 4 hours. The purpose of the development phase is to provide a rigid skeletal-crystal framework to support the remaining matrix when the temperature is raised to complete crystallization.

This glass-ceramic body is then formed by heating to a temperature of 150° to 300° F above the temperature corresponding to the viscosity of $10^{7.65}$ poises of the parent glass. This temperature is maintained until the desired degree of crystallinity is obtained. The final crystallization phase of the heat treating cycle is typically ¼ to 4 hours at the highest practical temperature which does not cause the glass ceramic to flow. This heat treatment promotes high temperature dimensional stability in the finished glass-ceramic. This heat treatment temperature is in the neighborhood of the solidus temperature.

In actual practice, it has been found that all three stages of the heating process can be accomplished by continuously advancing the temperature through regions of nucleation, development and crystallization. In many compositions of the present invention, it has been found that a "formal" development stage is not required because the time required to heat the article from the nucleation temperature to the crystallization temperature is sufficient. Additional details for forming glass-ceramic bodies are described in U.S. Pat. No. 3,117,881, the disclosure of which is incorporated by reference.

In practicing the present invention, the glass-ceramic dopant host is formed from a barium aluminoborosilicate parent glass which is substantially free of alkali metal oxides and consisting essentially of the following ingredients on a molar percent basis.

| Component | Broad Range Mole % |
|---|---|
| SiO$_2$ | 40 < to 60 |
| Al$_2$O$_3$ | 10 to 30 |
| B$_2$O$_3$ | 20 to 40 |
| BaO | 1 to 15 |
| Alkaline earth oxides selected from the group consisting of BaO, MgO CaO, SrO, and mixtures thereof | 3 to 20 |
| Wherein $4 \geq \dfrac{Al_2O_3}{\text{Alkaline earth oxides}} \geq 1.5$ | |

Usually the sum total of alkali metal oxides is less than about 0.5 mole % and preferably less than 0.1 mole % in the above compositions.

In a practice of the present invention, which is preferred for long service life as well as efficient and controlled boron doping and structural rigidity at high temperatures within the above range the composition consists essentially of:

| Component | Preferred Range Mole % |
|---|---|
| SiO$_2$ | 40 < to 55 |
| Al$_2$O$_3$ | 10 to 30 |
| B$_2$O$_3$ | 20 to 40 |
| BaO | 3 to 15 |
| Alkaline earth oxides | 5 to 15 |
| Wherein $4 \geq \dfrac{Al_2O_3}{\text{Alkaline earth oxides}} \geq 2$ | |

As will be apparent from the examples that follow the combination of BaO with MgO and the other alkaline earth oxides extends the range of glass formation and provides long service life, structural rigidity and controlled rate of boron doping at high temperatures.

In addition to the above oxides, the term "consisting essentially of" is intended to include minor proportions (i.e. up to about 10 mole %) of other than alkali oxides such as glass forming oxides, modifying oxides, nucleant oxides (e.g. TiO$_2$ and/or ZrO$_2$) and refining aids, when such ingredients are not detrimental to the semiconductor doping and are required to achieve specific chemical or physical properties.

The ratio the $$\left[ \dfrac{Al_2O_3}{\text{alkaline earth oxides}} \right]$$

is important from the standpoint of glass formability and high temperature stability in the resulting glass-ceramic dopant host. When the ratio of $$\left[ \dfrac{Al_2O_3}{\text{alkaline earth oxides}} \right]$$

is less than about 1.5, the glass-ceramic dopant host wafers may have a tendency to deform at doping temperatures in the neighborhood of 1100°–1200° C. When the ratio of $$\left[ \dfrac{Al_2O_3}{\text{alkaline earth oxides}} \right]$$

is greater than about 4 it becomes more difficult to melt and form the parent glass.

In accordance with one embodiment of the present invention and with reference to the attached drawings, a suitable N type silicon substrate 10 is prepared by any of the known techniques of obtaining monocrystalline bodies of silicon. For example, a monocrystalline ingot can be formed of highly purified silicon. The ingot is cut into transverse slices and the slices are diced to form silicon wafers of the desired dimension. The surface of the substrate can be prepared by suitable cleaning and polishing. However, the polished and cleaned semiconductive silicon materials can be commercially purchased. Polishing or cleaning of the surface can be accomplished by mechanical means such as lapping or the like or by chemical means, such as etching which is well understood in the art and does not form a part of the present invention.

Furthermore, the N type silicon wafer can be part of a complex semiconductor device and already have one or more P-N junctions arranged in any geometric pattern therein. The only important feature is that at least a part of the exposed surface of the silicon wafer exhibit "N" type of conduction. Accordingly, the term N type silicon as used herein includes such complex semiconductor devices having alternating zones of P and N type conduction.

For conventionally grown crystals, the surface may be chemically polished with a suitable etchant; for example, a concentrated solution of three parts hydrofluoric acid, three parts acetic acid and five nitric acid, by volume. Alternatively, the surface may be prepared by lapping or etching with a hot solution of water containing about 10% sodium hydroxide at ambient temperature and up to about 90° C. These cleaning and etching operations function for the purpose of removing contaminants from the surface and to make the surface uniform with a high degree of smoothness. These preparatory operations are well understood in the art.

Formation of P-N junctions of the present invention have been found to occur to a desirable extent on N type silicon having a resistivity of about 10 ohm-centimeters. It is, of course, readily apparent that the precise size and nature of the wafer is not critical. For example, wafers conventionally used can be 1, 2, or 3 inches in diameter or even more. The thickness can range from 5 to 20 mils, although this can vary. Typical wafers are 8 to 10 mils thick. Likewise, the resistivity of suitable N type silicon starting materials ranges from about 0.1 to about 100 ohm-centimeters.

An oxide layer 11 is grown on the surface of wafer 10 in accordance with this invention. The wafer is heated in the vapors of B$_2$O$_3$ so that a film or coating is formed over at least a portion of the surface of the wafer. A mask or protective covering can be utilized so as to develop any pattern as is understood in the art. The coating or film 11 is of glassy nature and contains boron in one form or another.

The temperature of this operation is such that simultaneously, some boron diffuses from the film or deposit 11 into the wafer 10 forming a thin boron diffused surface layer or region 12 adjacent the coating 11. The region 12 is a boron diffused layer of P-type conductivity in the N conductivity silicon 10. The juncture depth can vary, but in general, it is up to about 10 microns in thickness. The minimum thickness can vary and illustratively is about 0.1 micron. It is in or on or below this glassy layer 11 that the electrically insulating deposit of the compound believed to be boron silicide forms. The present invention reduced the tendency for formation of this insulating compound and facilitates removal of the decreased amount that might form.

Figure 2:
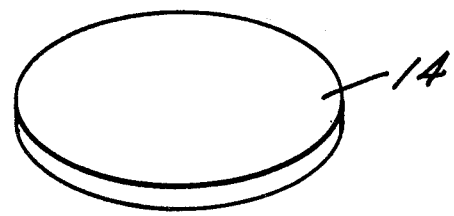
FIG. 2 is an isometric view of a solid $B_2O_3$-containing glass-ceramic dopant wafer as described herein.

FIG. 2 shows a disc or wafer of the $B_2O_3$-containing glass-ceramic dopant host, which functions as the source of $B_2O_3$ vapors for contact with the silicon wafers.

When positioned in a suitable furnace used for the invention, and when subjected to temperatures in the range of 700° to 1250° C, more particularly 1050° to 1200° C, the glass-ceramic dopant wafer liberates $B_2O_3$ vapors, which vapors then flow through the furnace high temperature zone in the direction of contacting the silicon wafers positioned in the vicinity of the dopant wafer. Generally, the method comprises diffusing boron into a semiconductor silicon element by positioning at least one semiconductor silicon element in a furnace, positioning a solid dopant wafer, disc or similar body in the furnace in the vicinity of, but not in physical contact with the silicon element, and then subjecting the silicon element and glass-ceramic dopant to an elevated temperature in the range mentioned above. At these temperatures the dopant liberates $B_2O_3$ vapors which vapors then pass through the furnace and contact at least a portion of the surface of the silicon element. This process is conducted for a sufficient period of time to permit the diffusion of boron into at least one portion of the surface of the silicon element to form a diffusion region therein. After the $B_2O_3$ vapors react with the hot silicon surface, the elemental boron diffuses into the silicon chip with continued heating. This boron diffusion step can be conducted in the absence of the glass-ceramic dopant wafer if desired.

As a further aspect to this embodiment of the invention, the doping process is further controlled and enhanced by the use of free-flowing inert carrier gas such as argon, or nitrogen. As used here, the expression "inert gas" means that the carrier gas does not enter into the chemical reaction between the $B_2O_3$ vapors and the hot silicon surface.

Figure 3:
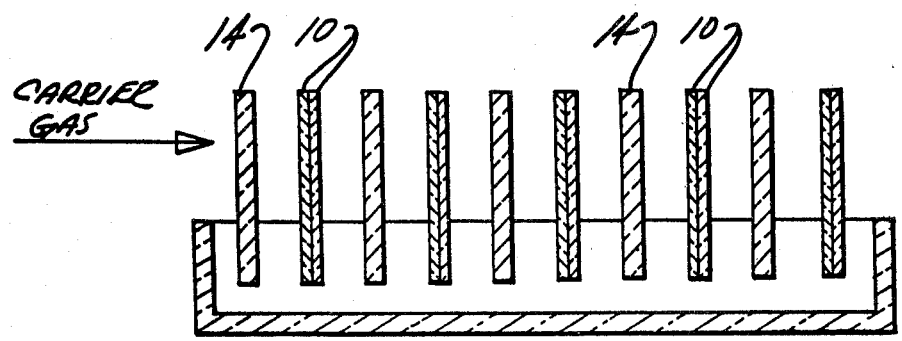
FIG. 3 is an elevation view showing a refractory container in which a plurality of solid wafers of the $B_2O_3$-containing glass-ceramic and a plurality of silicon wafers are arranged for practicing the present invention.

This is shown in FIG. 3, wherein the carrier gas enters from the left and passes across wafer 14 where the $B_2O_3$ is released and contacts the exposed surfaces of the silicon wafer 10. By placing two silicon wafers back-to-back, the reverse side of each of the silicon chips receives no boron from the process and consequently retains its original character as an N type silicon. Following the doping process, the diffusion depth can be further increased to diffuse the junction deeper by a simple heat treatment in an inert atmosphere. This can be carried out in a separate furnace if desired. The process has been described in terms of silicon semiconductors because of their commercial importance, and their tendency to form the insulating deposit of the boron silicide compound. The same process can be applied to germanium semiconductors, although somewhat lower doping temperatures are employed in the doping of germanium because of its 937° C melting point.

In preparing the glass-ceramic dopants, suitable compositions containing appropriate raw materials can be melted to form a homogeneous glass. Illustratively, compositions described above can be melted to form a homogeneous glass at 1500° to 1650° C in a refractory vessel. Generally, this melting procedure requires about 15 minutes to several hours to achieve homogeneity. It can be desirable to add additional $B_2O_3$ to the melt to account for losses due to volatilization. It is desirable to keep the melting time as short as possible in order to reduce the losses due to volatilization. Also, the batch material should be as pure as possible so as to minimize the presence of impurities.

The dopant host can be produced in a number of ways. The parent glass can be melted from metal organic derived materials to minimize the content of undesirable ingredients as disclosed in commonly assigned U.S. Pat. No. 3,640,093, the disclosure of which is incorporated by reference, or it can be melted from conventional high purity glassmaking ingredients.

Clearly, the presence of impurities can deleteriously affect the electrical performance of the doped silicon semiconductor device. Impurities specifically to be excluded or held at an absolute minimum are the oxides of the alkalis, i.e., $Li_2O$, $Na_2O$, $K_2O$, $Cs_2O$, or $Rb_2O$ and other high vapor pressure components such as PbO, $SnO_2$, and CuO.

After the glass compositions are melted and formed into a homogeneous molten mass, the glasses can be cast into any desired shape. Conveniently, this can be carried out by casting the glass into preheated graphite molds in the shape of right circular cylinders of a diameter approximating that of the finished diffusion disc. The glass can be permitted to cool and when cold the glass billet or cylinder is removed and inspected for flaws and then sliced into wafers usually ranging from 0.025 to 0.100 inches in thickness. At this point, the glass wafers are in a form for conversion to a glass-ceramic. Alternatively, the glass billet or a core drilled section can be heat treated to form the glass-ceramic in which glass-ceramic is then sliced into wafers. Because of the very close control made possible by the present invention, a plurality of silicon elements can be treated by appropriate positioning of a plurality of glass-ceramic dopant wafers arranged in a boat as shown in FIG. 3.

In carrying out this aspect of the invention, the doping is accomplished by placing the glass-ceramic dopant chips near and parallel to, but not touching, the silicon wafer to be doped. Generally, for best results, the distance has been determined to be about ⅛ inch. In a multi-slotted fused silica boat or other refractory vessel, container or the like, as many as 100 or more silicon chips or wafers can be doped to a uniform level by alternately spacing a glass-ceramic wafer, and a pair of wafers in back-to-back contact with confronting faces, silicon wafers and glass-ceramic wafers, being substantially parallel. The general arrangement can be as shown in FIG. 3.

Time and temperature of doping conditions are selected to give the appropriate P-N junction depth and sheet resistivity for the desired device configuration. This is shown in the examples that follow.

Spacing of the chips in the boat and selection of ambient inert carrier gas and the flow rate are based on requirements that silicon chips facing in the direction of the ambient gas flow receive equivalent doping to those facing counter to the flow.

The invention will be further explained in the examples that follow wherein all percentages are in mole percentages and temperatures are in °C unless stated otherwise.

EXAMPLE 3

Part A

One pound of high purity batch materials are melted in a platinum crucible at 1620° C. for about 5 to 6 hours, in an electric furnace, under an air atmosphere with occasional manual stirring to yield a clear, molten, homogeneous glass having the following composition:

| Component | Mole % |
|---|---|
| $SiO_2$ | 42.9 |
| $B_2O_3$ | 29.6 |
| $Al_2O_3$ | 19.0 |
| alkaline earth oxides | 8.5 |
| BaO | 5.4 |
| MgO | 3.1 |
| $\frac{Al_2O_3}{\text{alkaline earth oxides}}$ | 2.23 |

The molten glass is removed from the furnace and poured into a steel mold (at room temperature) having a cylindrical cavity 2.5 inches deep and 2.5 inches in diameter. When the glass looks to the point where it is rigid and self supporting, it is immediately transferred to a heat treating furnace having a temperature of 720° C and subjected to the following crystallization heat treatment.

Part B

Crystallization Heat Treatment

The glass cylinder from Part A, is held at 720° C for 16 hours. The temperature is then raised to 1200° C and maintained for 1 hour. The furnace is then turned off and allowed to cool to room temperature. The resulting nonporous, glass-ceramic cylinder has a milky-white opaque appearance.

The glass-ceramic material is uniformly ground down to 1½ inch diameter using an abrasive wheel and sliced with a diamond saw into several thin glass-ceramic wafers having thicknesses in the range of about 40 to 100 mils.

Part C

Planar Diffusion Doping

Planar diffusion doping is accomplished by placing some of the glass-ceramic wafers of Part B about ⅛ to ¼ inch from, and a parallel confronting relationship to, the silicon wafers to be doped. The glass-ceramic wafers and silicon wafers are arranged in multislotted, fused silica trays by alternately spacing a glass-ceramic wafer, and so on. The general assembly is as shown in FIG. 3.

The silicon wafers used in this example originally are N-type, and have a resistivity of about 0.1 to 0.5 ohm-cm.

The assembly is placed in a diffusion furnace and nitrogen gas is passed therethrough as an inert carrier gas as shown in FIG. 3 at the rate of 1 standard liter/minute, while the doping period is ½ hour at a temperature of 1150° C.

At the end of this diffusion doping period, the silicon wafer is cooled to room temperature. The silicon wafer is then etched in dilute hydrofluoric acid to remove the glassy layer. The silicon wafer is examined and there is only a slight visible stain on the surface indicating little boron silicide present.

The surface of the doped silicon wafers exhibit P-type conductivity. Surface testing of the doped wafers is conducted with a four-point conductivity probe. The surface resistivity is about 4 ohms per square. The slight stain does not prevent the measurement of surface conductivity.

The dopant wafers (even those thin wafers of 40 mil thickness) have not slumped or otherwise physically deformed at the end of the diffusion doping process so as to render them unsuitable for further planar doping. When doping an N-type germanium semiconductor according to the present invention, somewhat lower temperatures are employed because germanium melts at 937° C.

The foregoing procedures are repeated except that during the last 5 to 10 minutes of the doping period oxygen gas is substituted for the nitrogen gas at the same flow rate. Under these conditions a slight stain is still visible on the silicon after doping but it is completely removed by the hydrofluoric acid etch. The resulting surface resistivity of the doped silicon is about 4 ohms per square.

EXAMPLE 2

Part A

The following table demonstrates the prolonged service time of the dopant hosts in accordance with the present invention, even after extended periods of demanding service conditions of time and temperature. As used herein, "service time" refers to the total period which the particular dopant host has been used in effective doping. In many applications, the useful life of the dopant host has not been exceeded even after 800 hours of service time.

In Table A that follows the temperature for the prior service time is the same as the temperature for the doping test reported. The doping materials and procedures are as set forth in Example 1 with the time and temperatures as set forth below.

Table A

| Service time Hours (prior to this test) | Temperature ° C | Sheet Resistivity (Ω/ ) after "P" Doping | | | |
|---|---|---|---|---|---|
| | | Time (Hours) | | | |
| | | ¼ | ½ | 1 | 2 |
| 45 | 875 | 238 | 171 | 115 | 86 |
| 64 | 925 | 107 | 78 | 56 | 43 |
| 820 | 975 | 52 | 39 | 32 | 24 |
| 735 | 1025 | 31 | 21 | 16 | 12 |
| 64 | 1075 | 14 | 10 | 7 | |
| 64 | 1125 | 7 | 5 | | |
| 172 | 1150 | | 4 | 3 | |
| 132 | 1175 | 4 | 3 | | |
| 59 | 1200 | 3 | 2 | | |

At the end of the tests reported in Table A above, the dopant wafers have not slumped or otherwise physically deformed so as to render them unsuitable for further planar doping. The physical appearance of the dopant wafer is essentially the same as before any doping, and they are still doping effectively at the end of the tests even though the dopant wafers have not been treated or rejuvenated in any way.

Furthermore, the silicon wafers which have been doped with dopants having a service time in excess of about 150 to 200 hours do not have a dark stain thereon which indicates little or no boron silicide compound on the surface. In those instances where a slight stain does occur it can be removed by the process of admitting oxygen gas to the doping furnace at the end of the doping period followed by the hydrofluoric acid etch.

Part B

To further demonstrate the principles of the present invention, doping procedures and materials like those used in Part A of this example (except that the silicon being doped originally has an N-type resistivity of 4 to 7 ohm-cm) are employed. The time is ½ hour with the particular dopant host having a prior service time as indicated at the same temperature as the reported test temperature. The doping is carried out at two test temperatures of 975° and 1025° C. The results are set forth below.

Table B

| Prior Serivce Time | Sheet Resistivity (Ω/ ) after P Doping at 975° C for ½ Hour | Sheet Resistivity (Ω/ ) after P Doping at 1025° C for ½ Hour |
| --- | --- | --- |
| 0 | 39 | 21 |
| 25 | 37 | 18 |
| 50 | 36 | 21 |
| 75 | 36 | 21 |
| 100 |  | 21 |
| 125 | 39 | 20 |
| 150 | 37 | 22 |
| 175 |  |  |
| 200 | 40 | 22 |
| 225 | 39 | 21 |
| 250 |  | 21 |
| 275 |  | 21 |
| 300 | 39 | 21 |
| 325 |  |  |
| 350 |  |  |
| 375 | 39 | 21 |
| 400 |  |  |
| 425 | 41 | 22 |
| 450 |  |  |
| 475 | 40 | 22 |
| 500 |  |  |
| 525 |  |  |
| 550 | 40 | 23 |
| 575 |  |  |
| 600 |  |  |
| 625 | 41 | 23 |
| 725 | 37 | 21 |
| 825 | 39 |  |

At the end of those testing periods, none of the dopant wafers (even those thin wafers of 40 mil thickness) have slumped and maintain a planar configuration suitable for additional planar doping processing. The physical appearance of the dopant wafers are essentially the same as before any doping and they are still doping effectively at the end of the tests even though the dopant wafers have not been treated or rejuvenated in any way.

Furthermore, the silicon wafers which have been doped with dopants having a service time in excess of about 150 hours do not have a dark stain thereon which indicates little or no boron silicide compound on the surface.

EXAMPLES 3–6

To further demonstrate the principles of the present invention, several different barium aluminosilicate glass-ceramic dopant hosts are prepared and evaluated by the methods of Example 1. The results are set forth below.

| Example No. | 3 | 4 | 5 | 6 |
| --- | --- | --- | --- | --- |
| Mole % |  |  |  |  |
| $SiO_2$ | 46.8 | 55.0 | 55.0 | 48.0 |
| $Al_2O_3$ | 20.6 | 11.0 | 17.0 | 13.0 |
| $B_2O_3$ | 25.4 | 30.0 | 20.0 | 35.0 |
| Alkaline earth oxides | 7.3 | 4.0 | 8.0 | 4.0 |
| BaO | 5.5 | 3.0 | 5.0 | 3.0 |
| MgO | 1.7 | 1.0 | 3.0 | 1.0 |
| $Al_2O_3$/Alkaline earth oxides | 2.85 | 2.75 | 2.13 | 3.25 |
| Glass Appearance | clear | clear | clear | clear |
| Crystallization Heat Treatment ° C for (Hours) + | 720(64) | 720(16) | 720(16) | 720(16) |
| ° C for (Hours) | 1200(1) | 1200(3) | 1200(3) | 1200(3) |
| Sheet Resistivity (Ω/ ) after "P" Doping at ½ Hr. At ° C. |  |  |  |  |
| 1000 |  |  |  |  |
| 1100 |  |  |  |  |
| 1150 | 4.3 | 3.9 | 4.0 | 3.9 |
| 1200 |  |  |  |  |

In each of the Examples reported above, the condition and appearance of the dopant host after the doping is essentially the same as before the doping. There is no slumping or other physical deformation even for the thin wafers of 40 mil thickness which renders then unsuitable for further planar doping process.

The foregoing test results indicate that the compositions of invention are readily formed by glass-ceramic processes and doped efficiently at temperatures as high as 1200° C with structural stability and long service time. From the foregoing data, it is also apparent that the ranges of components have been extended and improved over commonly assigned copending case Ser. No. 431,212 filed Jan. 7, 1974 now U.S. Pat. No. 3,907,618. Examples 1 through 6 show that glass melting, glass-ceramic formation, and "boron" doping efficiency can be obtained with relatively high content of $SiO_2$ and relatively low contents of $B_2O_3$ to maintain a controlled rate of boron doping at high temperatures to reduce the tendency for staining of the doped silicon due to the accumulation of excess boron resulting in an insulating deposit of boron silicide. The BaO content (with or without other alkaline earth components such as MgO) is believed to be responsible for this unexpected extension and improvement of the composition range.

Having thus described the invention, what is claimed is:

1. A glass-ceramic dopant host for vapor phase transport of $B_2O_3$ at elevated temperatures prepared by the thermal in-situ crystallization of thermally crystallizable glass compositions consisting essentially of:

| Components | Mole % |
| --- | --- |
| $SiO_2$ | 40 < to 60 |
| $Al_2O_3$ | 10 to 30 |
| $B_2O_3$ | 20 to 40 |
| BaO | 1 to 15 |
| Alkaline earth oxides selected from the group consisting of BaO, MgO, CaO, SrO, and mixtures thereof | 3 to 20 |

-continued

| Components | Mole % |
|---|---|
| Wherein $4 \geq \dfrac{Al_2O_3}{\text{Alkaline earth oxides}} \geq 1.5$ | |

2. The glass-ceramic dopant host of claim 1 which consists essentially of:

| Component | Mole % |
|---|---|
| $SiO_2$ | 40 < to 55 |
| $Al_2O_3$ | 10 to 30 |
| $B_2O_3$ | 20 to 40 |
| BaO | 3 to 15 |
| Alkaline earth oxides | 5 to 15 |

-continued

| Component | Mole % |
|---|---|
| Wherein $4 \geq \dfrac{Al_2O_3}{\text{Alkaline earth oxides}} \geq 2$ | |

3. The glass-ceramic dopant host of claim 1 which is in the form of a thin wafer.

4. A glass-ceramic body resulting from the thermal in situ crystallization of a glass consisting essentially of in mole percent: over 40 and up to 60 $SiO_2$, 10 to 30 $Al_2O_3$, 20 to 40 $B_2O_3$, 3 to 20 alkaline earth oxides selected from the group consisting of BaO, MgO, CaO, SrO, and mixtures thereof, wherein BaO is present in the amount of 1 to 15, and the ratio of $Al_2O_3$ to alkaline earth oxides is in the range from 1.5 to 4.

5. A glass-ceramic body resulting from the thermal in situ crystallization of a glass consisting essentially of in mole percent: over 40 and up to 55 $SiO_2$, 10 to 30 $Al_2O_3$, 20 to 40 $B_2O_3$, 5 to 15 alkaline earth oxides selected from the group consisting of BaO, MgO, CaO, SrO, and mixtures thereof, wherein BaO is present in the amount of 3 to 15, and the ratio of $Al_2O_3$ to alkaline earth oxides is in the range from 1.5 to 2.

* * * * *

UNITED STATES PATENT AND TRADEMARK OFFICE
CERTIFICATE OF CORRECTION

PATENT NO. : 3,998,667
DATED : Dec. 21, 1976
INVENTOR(S) : James E. Rapp

It is certified that error appears in the above-identified patent and that said Letters Patent are hereby corrected as shown below:

Col. 10, Table A, line 48, ($\Omega/$ ) should be ($\Omega/\square$)

Col. 11, Table B, line 25, ($\Omega/$ ) should be ($\Omega/\square$)

Signed and Sealed this

Twenty-seventh Day of March 1979

[SEAL]

Attest:

RUTH C. MASON
*Attesting Officer*

DONALD W. BANNER
*Commissioner of Patents and Trademarks*